(12) United States Patent
Brown et al.

(10) Patent No.: US 11,309,370 B1
(45) Date of Patent: Apr. 19, 2022

(54) ELECTRONIC DEVICE DISPLAYS WITH CURVED SURFACES

(71) Applicant: Apple Inc., Cupertino, CA (US)

(72) Inventors: Michael J. Brown, Campbell, CA (US); Yi Qiao, San Jose, CA (US); Tyler R. Kakuda, Stockton, CA (US); Alexis G. Soyseven, Santa Clara, CA (US); Jean-Pierre S. Guillou, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/239,413

(22) Filed: Jan. 3, 2019

Related U.S. Application Data

(60) Provisional application No. 62/616,676, filed on Jan. 12, 2018.

(51) Int. Cl.
| | | |
|---|---|---|
| *H01L 27/32* | (2006.01) | |
| *G02F 1/1335* | (2006.01) | |
| *H05K 1/11* | (2006.01) | |
| *H01L 51/52* | (2006.01) | |
| *G02F 1/1333* | (2006.01) | |

(52) U.S. Cl.
CPC .... *H01L 27/3244* (2013.01); *G02F 1/133305* (2013.01); *G02F 1/133528* (2013.01); *H01L 51/5287* (2013.01); *H01L 51/5293* (2013.01); *H05K 1/118* (2013.01); *H01L 2251/5338* (2013.01)

(58) Field of Classification Search
CPC . H01L 27/32; H01L 51/5293; H01L 51/5287; H01L 2251/5338; H05K 1/118; G02F 1/133528; G02F 1/133305
USPC .......................................................... 362/551
See application file for complete search history.

(56) References Cited

U.S. PATENT DOCUMENTS

| | | | |
|---|---|---|---|
| 28,341 A | 5/1860 | Bennett | |
| 4,349,817 A | 9/1982 | Hoffman et al. | |
| 4,534,813 A | 8/1985 | Williamson et al. | |
| 4,609,252 A * | 9/1986 | Wong .................. | G02B 6/2804 385/130 |
| 5,329,386 A | 7/1994 | Birecki et al. | |
| 5,502,457 A | 3/1996 | Sakai et al. | |
| 5,659,378 A | 8/1997 | Gessel | |
| 6,046,730 A | 4/2000 | Bowen et al. | |

(Continued)

FOREIGN PATENT DOCUMENTS

KR 20180034832 A 4/2018

*Primary Examiner* — Sean P Gramling
(74) *Attorney, Agent, or Firm* — Treyz Law Group, P.C.; Joseph F. Guihan

(57) ABSTRACT

A plurality of fibers may be included in an electronic device display to allow the display to have a curved output surface. Each fiber may guide light from one or more display pixels on the display panel to a display output surface. The fibers may be bent, allowing light from the display pixels to be displayed on a three-dimensional display output surface of any desired shape. The fibers may be formed from a high refractive index core surrounded by a cladding. The fibers may be formed from an activated photoactive material. The fibers may cover the entire display panel, the periphery of the display panel, or the corners of the display panel. The display panel may have one or more bends. Polarizing fibers may be used to both guide light from the display panel and serve as a linear polarizer for the display.

37 Claims, 16 Drawing Sheets

(56) References Cited

U.S. PATENT DOCUMENTS

| | | |
|---|---|---|
| 6,407,785 B1 | 6/2002 | Yamazaki |
| 6,467,922 B1 | 10/2002 | Blanc et al. |
| 6,680,761 B1 | 1/2004 | Greene et al. |
| 6,845,190 B1 | 1/2005 | Smithwick et al. |
| 7,228,051 B2 | 6/2007 | Cok et al. |
| 7,542,209 B2 | 6/2009 | McGuire, Jr. |
| 7,823,309 B2 | 11/2010 | Albenda |
| 7,856,161 B2 | 12/2010 | Tabor |
| 8,045,270 B2 | 10/2011 | Shin et al. |
| 8,723,824 B2 | 5/2014 | Myers et al. |
| 8,824,779 B1 | 9/2014 | Smyth |
| 8,976,324 B2 | 3/2015 | Yang et al. |
| 9,268,068 B2 | 2/2016 | Lee |
| 9,312,517 B2 | 4/2016 | Drzaic et al. |
| 9,342,105 B2 | 5/2016 | Choi et al. |
| 9,509,939 B2 | 11/2016 | Henion et al. |
| 9,591,765 B2 | 3/2017 | Kim et al. |
| 9,755,004 B2 | 9/2017 | Shieh et al. |
| 9,818,725 B2 | 11/2017 | Bower et al. |
| 9,907,193 B2 | 2/2018 | Lee et al. |
| 10,048,532 B2 * | 8/2018 | Powell .............. G02F 1/133524 |
| 10,052,831 B2 | 8/2018 | Welker et al. |
| 2006/0016448 A1 | 1/2006 | Ho |
| 2007/0097108 A1 | 5/2007 | Brewer |
| 2008/0144174 A1 | 6/2008 | Lucente et al. |
| 2008/0186252 A1 | 8/2008 | Li |
| 2010/0177261 A1 | 7/2010 | Jin et al. |
| 2010/0238090 A1 | 9/2010 | Pomerantz et al. |
| 2011/0025594 A1 | 2/2011 | Watanabe |
| 2011/0057861 A1 | 3/2011 | Cok et al. |
| 2011/0102300 A1 | 5/2011 | Wood et al. |
| 2011/0242686 A1 | 10/2011 | Wantanbe |
| 2012/0218219 A1 | 8/2012 | Rappoport et al. |
| 2013/0081756 A1 | 4/2013 | Franklin et al. |
| 2013/0083080 A1 | 4/2013 | Rappoport et al. |
| 2013/0235560 A1 | 9/2013 | Etienne et al. |
| 2013/0279088 A1 | 10/2013 | Raff et al. |
| 2014/0037257 A1 * | 2/2014 | Yang .................... G02B 6/0078 385/116 |
| 2014/0092028 A1 | 4/2014 | Prest et al. |
| 2014/0092283 A1 * | 4/2014 | Yang .................. G02B 26/0841 348/294 |
| 2014/0092346 A1 * | 4/2014 | Yang .................... H01L 27/323 349/84 |
| 2014/0183473 A1 | 7/2014 | Lee et al. |
| 2014/0218956 A1 * | 8/2014 | Wu .......................... G09F 9/35 362/554 |
| 2014/0240985 A1 | 8/2014 | Kim et al. |
| 2014/0320543 A1 * | 10/2014 | Oh ....................... H01L 27/326 345/690 |
| 2014/0328041 A1 | 11/2014 | Rothkopf et al. |
| 2014/0354920 A1 | 12/2014 | Jang et al. |
| 2015/0001483 A1 * | 1/2015 | Namkung .......... H01L 51/5268 257/40 |
| 2015/0093087 A1 | 4/2015 | Wu |
| 2015/0227227 A1 | 8/2015 | Myers et al. |
| 2016/0196778 A1 * | 7/2016 | Cha ....................... G09G 3/20 345/694 |
| 2016/0231784 A1 | 8/2016 | Yu et al. |
| 2016/0234362 A1 | 8/2016 | Moon et al. |
| 2016/0238785 A1 * | 8/2016 | Park .................... G02B 6/0076 |
| 2017/0235341 A1 | 8/2017 | Huitema et al. |
| 2018/0052312 A1 | 2/2018 | Jia et al. |
| 2018/0088416 A1 | 3/2018 | Jiang et al. |
| 2018/0128973 A1 * | 5/2018 | Powell ................ H01L 51/5275 |
| 2018/0372958 A1 | 12/2018 | Karafin et al. |

* cited by examiner

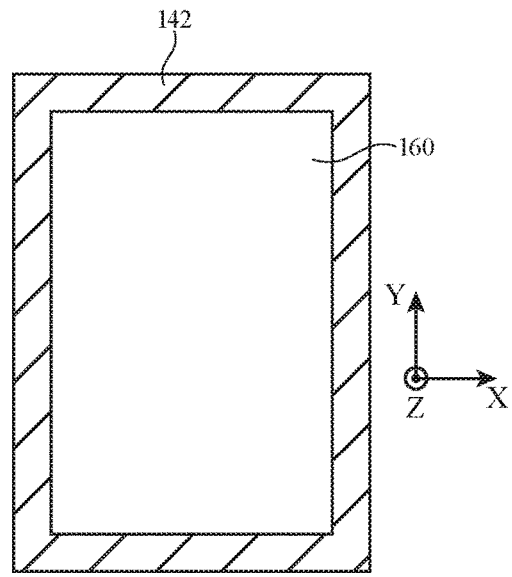
FIG. 11A
FIG. 11B
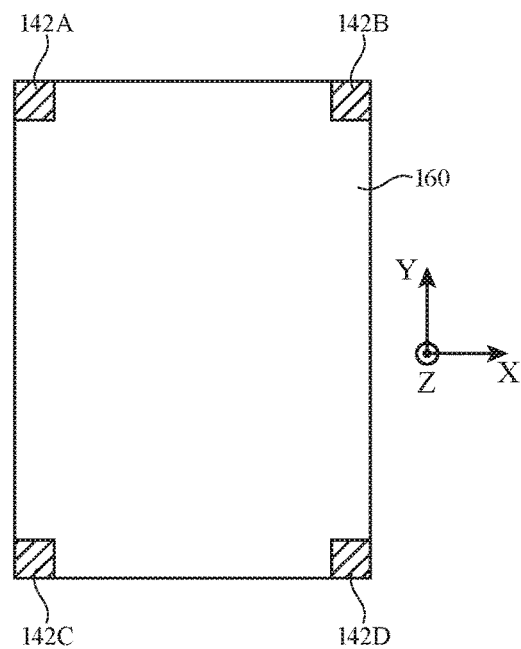
FIG. 11C

ELECTRONIC DEVICE DISPLAYS WITH CURVED SURFACES

This application claims priority to U.S. provisional patent application No. 62/616,676 filed Jan. 12, 2018, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode display based on organic-light-emitting diode pixels or a liquid crystal display based on liquid crystal pixels. In some cases, it may be desirable for a display to have a curved display surface. However, it may be difficult to curve conventional organic light-emitting diode displays and liquid crystal displays to have the desired curved display surface.

It would therefore be desirable to be able to provide improved displays for electronic devices.

SUMMARY

An electronic device may have a display such as an organic light-emitting diode display or a liquid crystal display. To allow the display to have a curved output surface, the display may include a plurality of fibers.

Each fiber may guide light from one or more display pixels on the display panel to a display output surface. The fibers may be bent, allowing light from the display pixels to be displayed on a three-dimensional display output surface of any desired shape. The fibers may be formed from a high refractive index core surrounded by a cladding. The fibers may be attached to a flexible substrate that is then attached to an electronic device component such as the interior surface of the display cover layer.

The fibers may also be formed by activating a photoactive material using one or more light sources. One light source may be used to form a plurality of linear fibers in the photoactive material, or two or more light sources may be used to form non-linear fibers in the photoactive material. The light source for activating the photoactive material may be a laser that emits visible or ultraviolet light.

The fibers may cover any desired portion of the underlying display panel. For example, the fibers may cover the entire display panel, the periphery of the display panel, or the corners of the display panel. The display panel may also have one or more bends to help form the desired display output surface.

Organic light-emitting diode displays and liquid crystal displays may include a linear polarizer layer. To reduce the thickness of the display and the distance between the display plane and the display output surface, polarizing fibers may be used to both guide light from the display panel and serve as the linear polarizer. In some embodiments, the polarizing fibers may extend into openings of the display cover layer such that the ends of the fibers form an outermost surface of the electronic device. This allows the display cover layer to be an opaque material such as a metal or a ceramic.

BRIEF DESCRIPTION OF THE DRAWINGS

FIGS. 11A-11C are top views of illustrative displays showing how fibers may be used to guide light from different portions of the displays in accordance with an embodiment.

DETAILED DESCRIPTION

Figure 1:
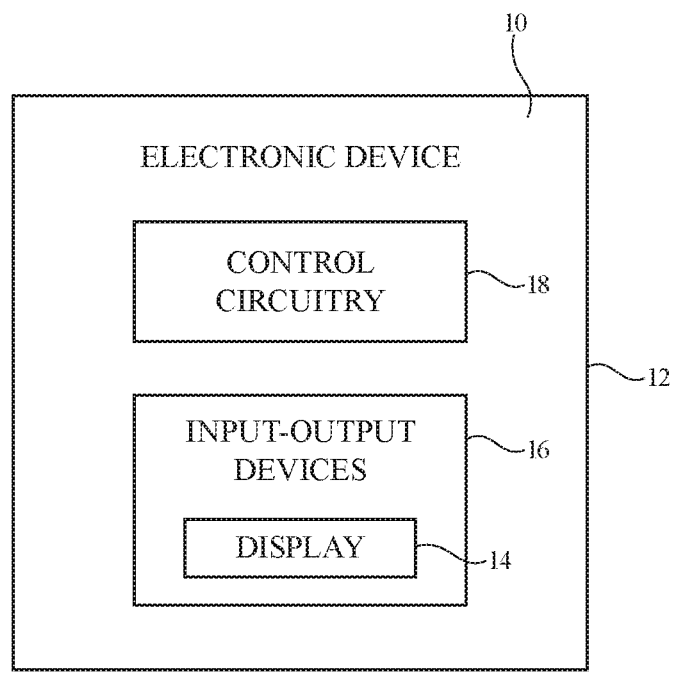
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in the example of FIG. 1, device 10 may have a housing such as housing 12. Housing 12 may be formed from plastic, metal (e.g., aluminum), fiber composites such as carbon fiber, glass, ceramic, other materials, and combinations of these materials. Housing 12 or parts of housing 12 may be formed using a unibody construction in which housing structures are formed from an integrated piece of material. Multipart housing constructions may also be used in which housing 12 or parts of housing 12 are formed from frame structures, housing walls, and other components that are attached to each other using fasteners, adhesive, and other attachment mechanisms. Glass structures, transparent polymer structures, image transport layer structures, and/or other transparent structures that cover display 14 and other portions of device 10 may provide structural support for device 10 and may sometimes be referred to as housing structures. For example, a glass or polymer layer that covers and protects a pixel array in display 14 may serve as a display cover layer while also serving as a housing structure for device 10.

As shown in FIG. 1, electronic device 10 may include control circuitry 18 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 18 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 16 may be used to allow data to be supplied to device 10 and to allow data to be provided from device 10 to external devices. Input-output devices 16 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 16 and may receive status information and other output from device 10 using the output resources of input-output devices 16.

Input-output devices 16 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted).

Control circuitry 18 may be used to run software on device 10 such as operating system code and applications. During operation of device 10, the software running on control circuitry 18 may display images on display 14.

Figure 2:
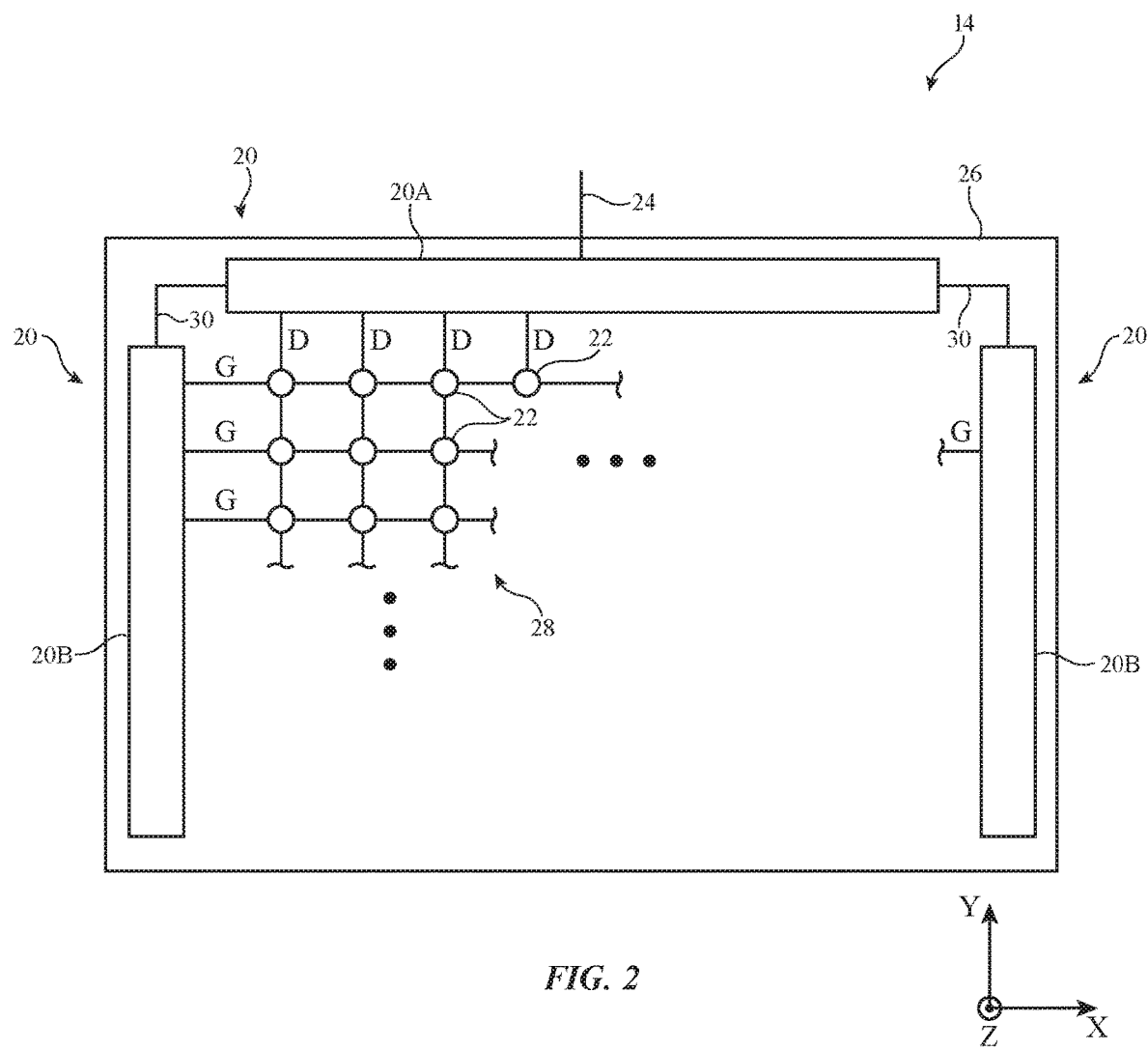
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 18 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G may be associated with a respective row of pixels 22.

If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
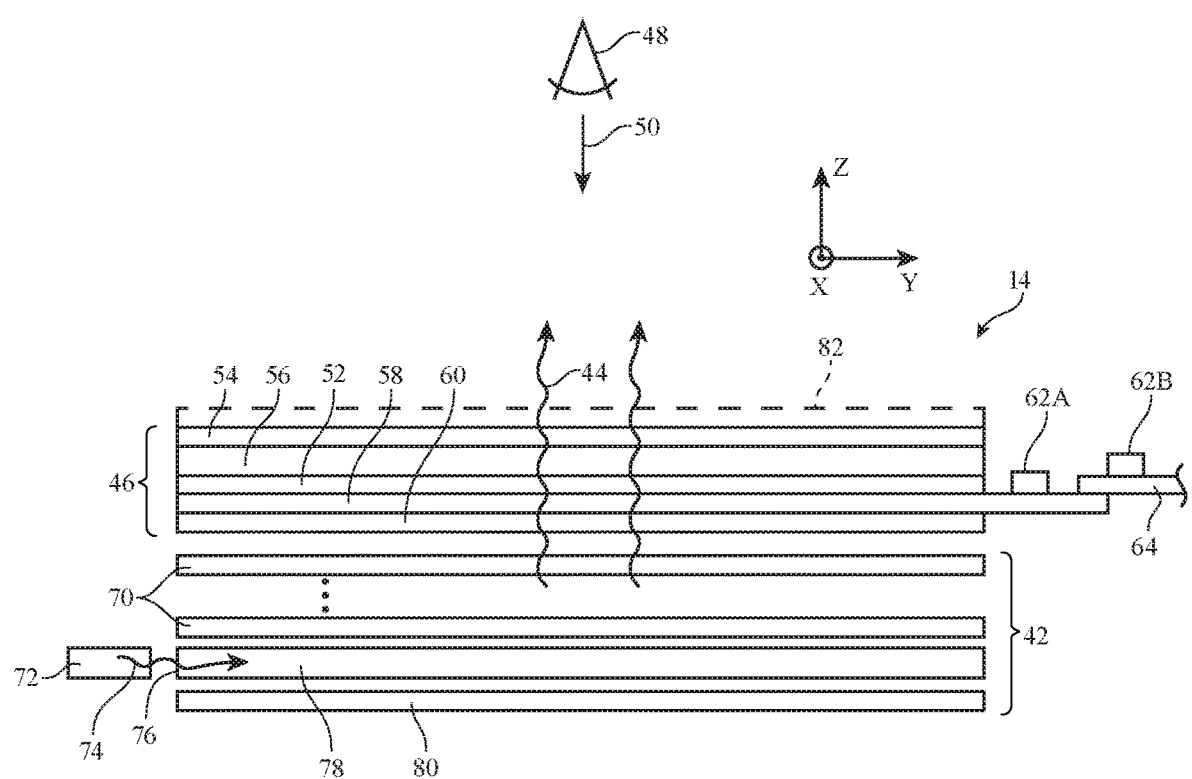
FIG. 3 is a cross-sectional side view of an illustrative liquid crystal display in accordance with an embodiment.

Display 14 may be a liquid crystal display or an organic light-emitting diode display, as examples. FIG. 3 is a cross-sectional side view of an illustrative liquid crystal display for device 10. As shown in FIG. 3, display 14 may include backlight structures such as backlight unit 42 for producing backlight 44. During operation, backlight 44 travels outwards (vertically upwards in dimension Z in the orientation of FIG. 3) and passes through pixels in display layers 46. This illuminates any images that are being produced by the pixels for viewing by a user. For example, backlight 44 may illuminate images on display layers 46 that are being viewed by viewer 48 in direction 50. Display layers 46 may sometimes collectively be referred to as a display panel.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

Display layers 46 may include a liquid crystal layer such a liquid crystal layer 52. Liquid crystal layer 52 may be sandwiched between display layers such as display layers 58 and 56. Layers 56 and 58 may be interposed between lower (inner) polarizer layer 60 and upper (outer) polarizer layer 54.

Layers 58 and 56 may be formed from transparent substrate layers such as clear layers of glass or plastic. Layers 58 and 56 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer in the upper or lower portion of display 14 may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide layer such as light guide layer 78. Light guide layer 78 may be formed from a transparent material such as clear glass or plastic (e.g., molded plastic that forms a light guide plate, a thin flexible plastic film, etc.). During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide layer 78 due to the principal of total internal reflection. Light guide layer 78 may include light-scattering features such as pits or bumps or other light-scattering structures. The light-scattering features may be located on an upper surface and/or on an opposing lower surface of light guide layer 78. Light source 72 may be located at the left of light guide layer 78 as shown in FIG. 3 or may be located along the right edge of layer 78 and/or other edges of layer 78.

Light 74 that scatters upwards in direction Z from light guide layer 78 may serve as backlight 44 for display 14. Light 74 that scatters downwards may be reflected back in the upwards direction by reflector 80. Reflector 80 may be formed from a reflective material such as a layer of plastic covered with a dielectric mirror thin-film coating.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and light collimating films such as brightness enhancement films and turning films. Optical films 70 may overlap the other structures in backlight unit 42 such as light guide layer 78 and reflector 80. For example, if light guide layer 78 has a rectangular footprint in the X-Y plane of FIG. 3, optical films 70 and reflector 80 may have a matching rectangular footprint. If desired, films such as compensation films may be incorporated into other layers of display 14 (e.g., polarizer layers).

Display 14 may include one or more additional layers such as layer 82 on top of polarizer 54. For example, layers such as layer 82 may include a wave plate or other optical film to adjust the polarization of the light exiting display 14.

Figure 4:
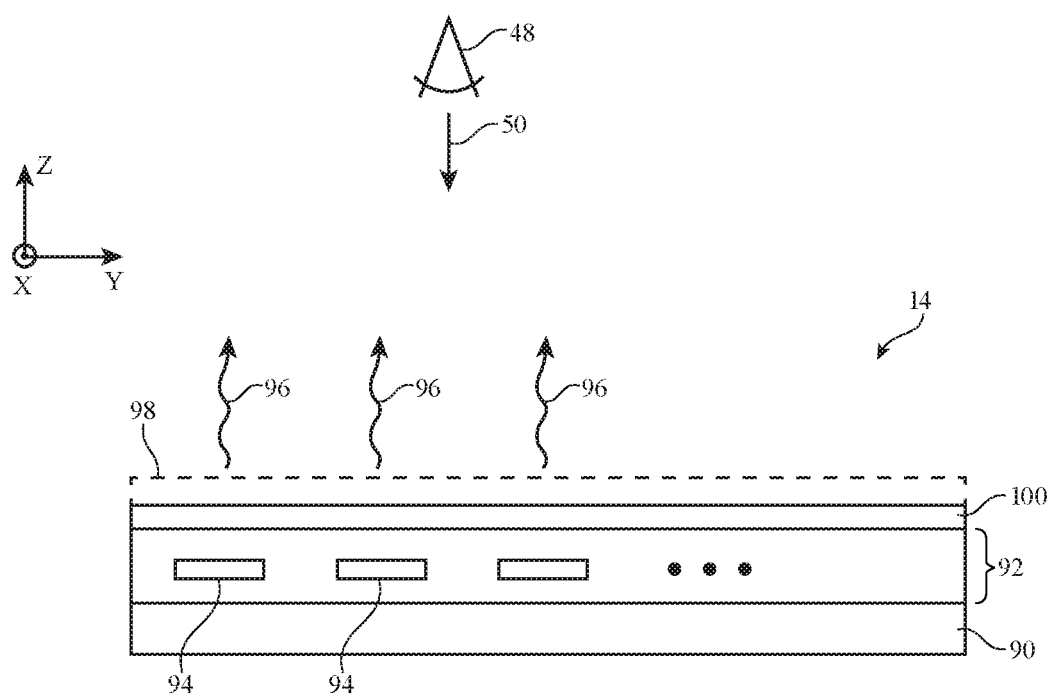
FIG. 4 is a cross-sectional side view of an illustrative organic light-emitting diode display in accordance with an embodiment.

FIG. 4 is a cross-sectional side view of an illustrative organic light-emitting diode display for use in device 10. As shown in FIG. 4, display 14 may include a substrate layer such as substrate layer 90. Substrate 90 may be formed from a polymer or other suitable materials. Thin-film transistor circuitry 92 may be formed on substrate 90. Thin film transistor circuitry 92 may include inorganic layers such as inorganic buffer layers, barrier layers (e.g., barrier layers to block moisture and impurities), gate insulator, passivation, interlayer dielectric, and other inorganic dielectric layers. Thin-film transistor circuitry 92 may also include organic dielectric layers such as a polymer planarization layer. Metal layers and semiconductor layers may be included within thin-film transistor circuitry 92 to form transistors and light-emitting diodes. For example, semiconductors such as silicon, semiconducting-oxide semiconductors, or other semiconductor materials may be used in forming semiconductor channel regions for thin-film transistors. Metal may be used in forming transistor gate terminals, transistor source-drain terminals, capacitor electrodes, and metal interconnects.

Light-emitting diodes 94 may be formed from the patterned layers of material in thin-film transistor circuitry 92 and may serve as pixels for display 14. In each light-emitting diode, organic emissive material and other light-emitting diode layers may be interposed between a respective anode and cathode. During operation, light-emitting diodes 94 may emit light 96 for forming images for viewing by viewer 48. Layers such as layers 98 and 100 may be formed on top of thin-film transistor circuitry 92. Layer 100 may be a circular polarizer for suppressing ambient light reflections from metal structures and other reflective structures in thin-film transistor circuitry 92. Circular polarizer 100 may include a linear polarizer and a quarter-wave plate. Optional layer 98 may be a wave plate or other optical film for adjusting the polarization of emitted light 96. Wave plates in device 10 may be formed from single-layer structures or multi-layer structures to provide broadband transmission spectrums and wide viewing angles. The organic light-emitting diode display structures shown in FIG. 4 may sometimes be referred to as a display panel.

In some cases, it may be desirable for display 14 to have a curved display surface. To form a curved display surface, display 14 may optionally be bent. However, display 14 may only tolerate bending in one direction (e.g., along one bending axis). Therefore, to allow a display surface to be curved in two directions (or to avoid any bending of display 14), the display may include a fiber relay (sometimes referred to as a group of fibers). The fiber relay may include a plurality of fibers that guide light from the display panel to the desired display output surface. The fibers may be flexible, enabling the display output surface to have any desired three-dimensional shape. For example, the display output surface may be curved in two directions, otherwise known as having compound curvature. When bent along only one direction, the display output surface may be flattened into a plane without distortion (sometimes referred to as developable surfaces). When bent along two directions, the display output surface has compound curvature (e.g., a surface that can only be flattened into a plane with distortion, sometimes referred to as a surface with Gaussian curvature).

Figure 5:
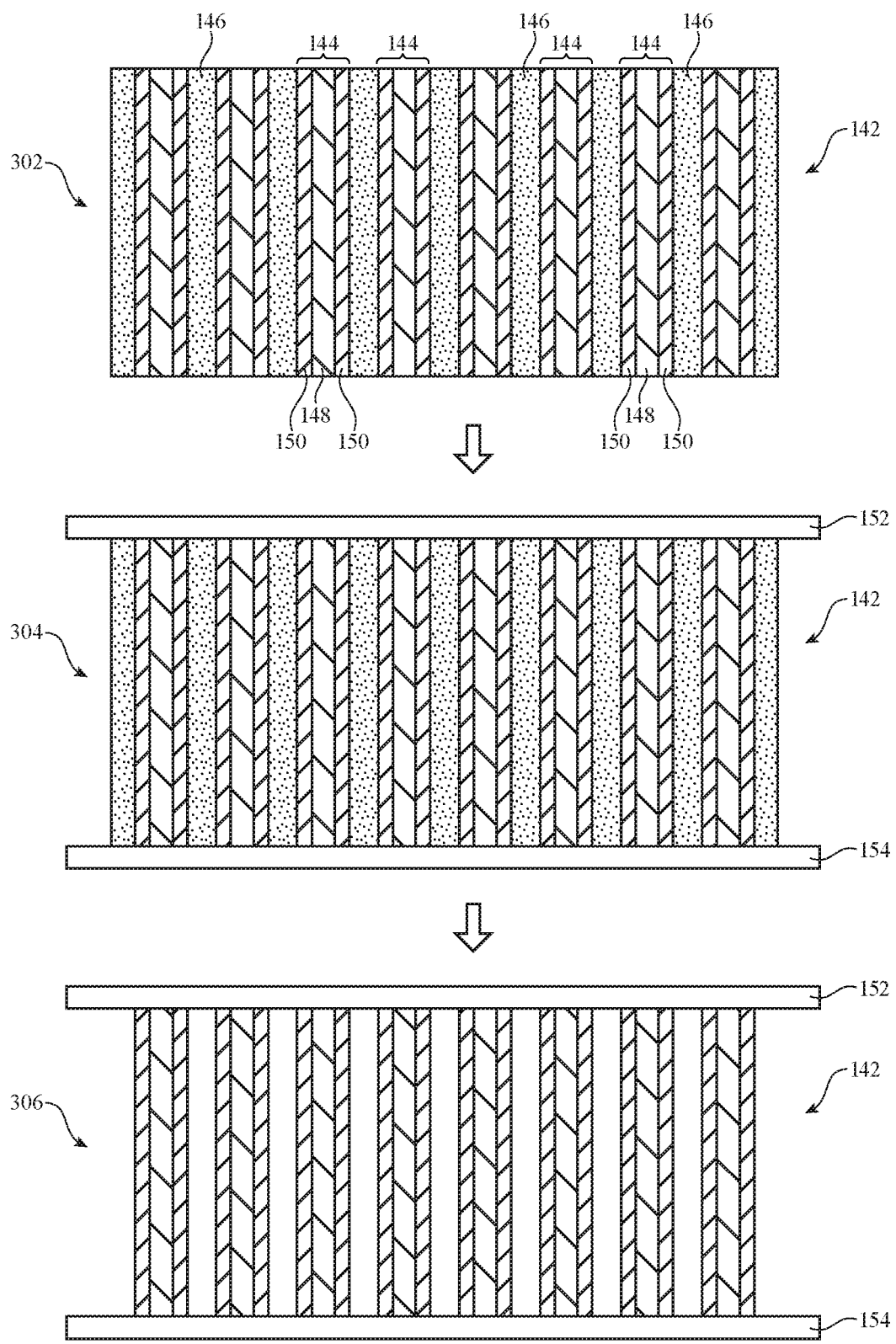
FIG. 5 shows cross-sectional side views of steps for forming a fiber relay in accordance with an embodiment.

FIG. 5 shows a cross-sectional side view of the formation of an illustrative fiber relay (sometimes referred to as a fiber bundle) for use in an electronic device display. As shown in FIG. 5, at step 302 a plurality of fibers may be encased in a host matrix material. Fiber relay 142 may include a plurality of fibers 144 that are surrounded by host matrix material 146. Each fiber 144 may include a core 148 that is surrounded by cladding 150. The cores may be formed from a clear material such as glass, polymer, etc. The index of refraction of the core may be greater than the index of refraction of the cladding to promote total internal reflection. Host matrix material 146 may be any desired material and may maintain the structural integrity of fiber relay 142. If desired, cladding 150 may be omitted from each fiber 144.

At step 304, fiber relay 142 may be attached between two substrates. As shown, a first end of each fiber 144 in fiber relay 142 may be attached to substrate 152 whereas a second opposing end of each fiber 144 in fiber relay 142 may be attached to substrate 154. Substrates 152 and 154 may be any desired layer or material. Substrate 152 may be a flexible substrate that can later be bent to form a desired display surface. Substrate 152 may sometimes be referred to as elastomeric and may be formed from any desired material (e.g., rubber, silicone, etc.). In one illustrative example, substrate 154 may be a display layer (e.g., a layer of display 14). For example, substrate 154 may be an upper polarizer (e.g., upper polarizer 54), a thin-film transistor layer (e.g., thin-film transistor layer 58), a color filter layer (e.g., color filter layer 56) or a wave plate or other optical film (e.g., additional layer 82) of a liquid crystal display (e.g., the liquid crystal display in FIG. 3). As yet other examples, substrate 154 may be a layer of thin-film transistor circuitry (e.g., thin-film transistor circuitry 92), a circular polarizer (e.g., circular polarizer 100) or a wave plate or other optical film (e.g., additional layer 98) of an organic light-emitting diode display (e.g., the organic light-emitting diode display in FIG. 4).

At step 306 host matrix material 146 may be removed from fiber relay 142. When the host matrix material 146 is removed, the remaining fibers 144 are free to bend into any desired shape. Therefore, if fiber relay 142 is attached to a display structure, the fiber relay allows light from display 14 to be mapped to the surface of any desired three-dimensional shape (e.g., an output surface having compound curvature).

Figure 6:
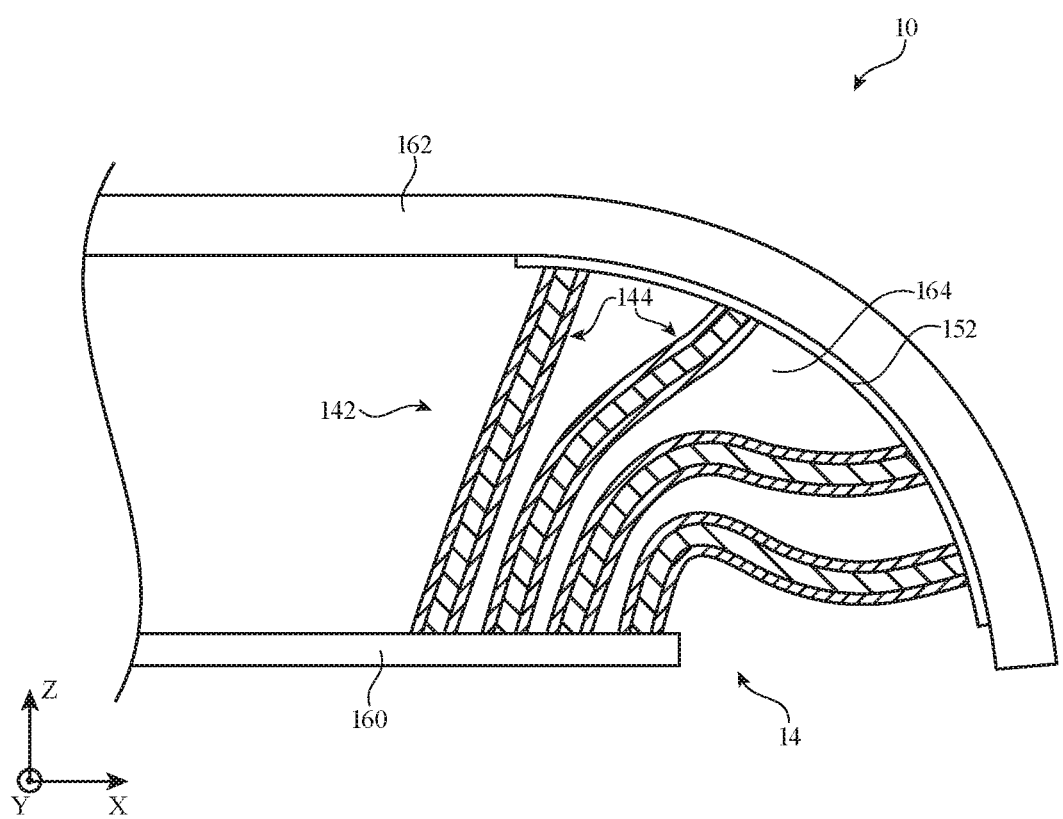
FIG. 6 is a cross-sectional side view of an illustrative electronic device with a fiber relay between a display panel and a flexible substrate in accordance with an embodiment.

FIG. 6 is a cross-sectional side view of an illustrative electronic device with a fiber relay of the type shown in FIG. 5. As shown, fiber relay 142 may include fibers 144, with each fiber having a core surrounded by a cladding. One end of each fiber may be attached to display panel 160 (e.g., display panel 160 may serve as substrate 154 from FIG. 5). The other end of each fiber may be attached to flexible substrate 152. The flexible substrate 152 may then in turn be attached to an interior surface of display cover layer 162. Display cover layer 162 may be a layer of clear glass, plastic, or other dielectric that covers the light-emitting surface of the underlying display panel. In another suitable arrangement, display cover layer 162 may be the outermost layer of display 14 (e.g., layer 162 may be a color filter layer, thin-film transistor layer, or other display layer). Buttons may pass through openings in cover layer 162. The cover layer may also have other openings such as an opening for a speaker port, openings for a sensor, or openings for any other desired electronic component.

As shown in FIG. 6, fiber relay 142 may be used to direct light from a planar edge portion of the display panel to a curved output surface. Because fibers 144 and substrate 152 are flexible, the light may be directed to an output surface of any desired shape. The flexible substrate may be attached to the interior surface of display cover layer 162 with adhesive (e.g., transparent adhesive).

The example in FIG. 6 of fiber relay 142 being used to direct light from the display panel to a display cover layer is merely illustrative. In general, fiber relay 142 may direct light from the display panel to any desired display output surface. For example, the fiber relay may be attached to the electronic device housing (e.g., housing 12 in FIG. 1) or another device component (instead of the display cover layer).

If desired, a filler material 164 may be formed in between fibers 144 of fiber relay 142 after flexible substrate 152 is attached to display cover layer 162. Filler material 164 may conform to the shape of the fibers to fill any voids between the fibers. This may help maintain the structural integrity of the fibers and keep the fibers in a desired position. Filler material 164 may be any desired material.

Each fiber 144 may be aligned with one pixel in display 14. Alternatively, each pixel may be overlapped by multiple fibers. In yet another embodiment, each fiber may overlap multiple pixels. In general, each pixel may be overlapped by any desired number of pixels (e.g., exactly one, more than one, less than one, etc.). Different pixels may also be overlapped by different numbers of fibers.

Each fiber 144 in FIG. 6 has a uniform cross-section across the length of the fiber. This example is merely illustrative. If desired, the cross-section of the fiber may change along the length of the fiber. For example, the cross-section of the fiber may progressively increase in surface area moving from the display panel to the display cover layer. In this way, the light from the display panel can be magnified onto a larger area on the display cover layer.

Figure 7:
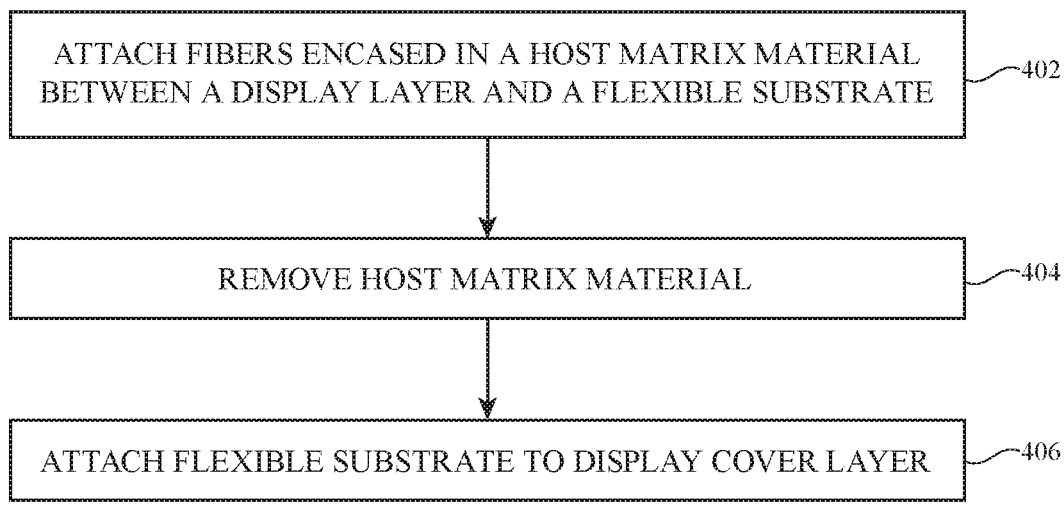
FIG. 7 is a flowchart of illustrative method steps for forming a fiber relay between a display panel and a display cover layer in accordance with an embodiment.

FIG. 7 is a flowchart of illustrative method steps for forming a fiber relay that maps output from a display panel to an arbitrary three-dimensional shape. As shown, at step 402 fibers that are encased in a host matrix material may be attached between a display panel (e.g., any layer in a display) and a flexible substrate. Once attached to the flexible substrate and display panel, the host matrix material may be removed at step 404. Once the host matrix material is removed, the fibers may be free to flex into any desired position based on the position of the flexible substrate. At step 406, the flexible substrate may be attached to a display cover layer (or other desired electronic device component such as a housing). The flexible substrate may be attached to a curved interior surface of a transparent display cover layer (as shown in FIG. 6), for example. Optionally, an additional filler material may be formed around the fibers of the fiber relay once the fiber relay is attached between the display panel and the display cover layer.

The example in FIGS. 5-7 of the fiber relay being formed from a plurality of fibers (each with a high refractive index core surrounded by cladding) initially encased in a host matrix material is merely illustrative. In another embodiment, fibers may be formed by activating a photoactive material using controlled exposure to light.

Figure 8:
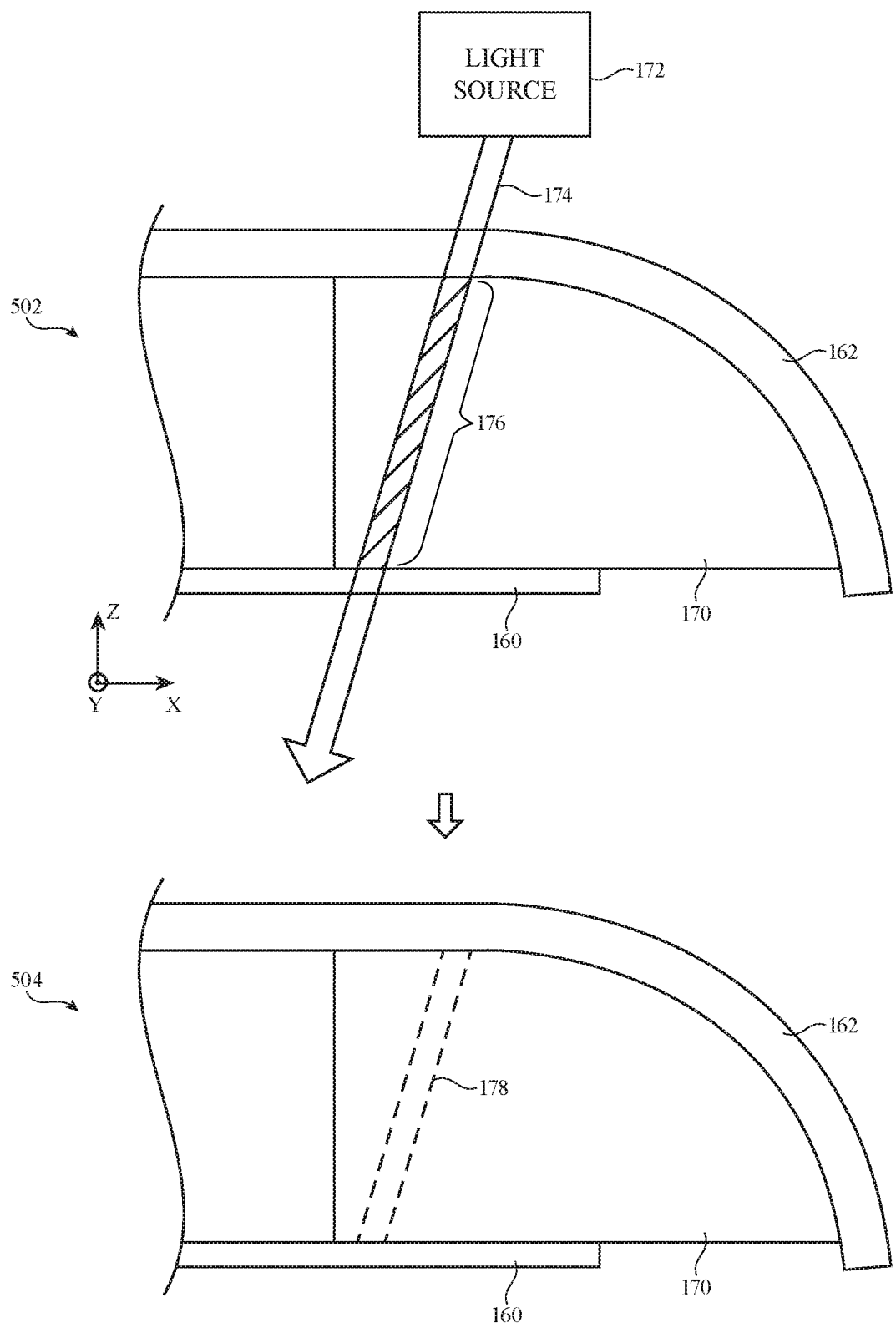
FIG. 8 shows cross-sectional side views of steps for forming a fiber using a photoactive material and a single light source in accordance with an embodiment.

FIG. 8 is a cross-sectional side view of an illustrative electronic device during formation of a fiber using a photoactive material. As shown in FIG. 8, at step 502 a photoactive material 170 is formed between display panel 160 and display cover layer 162. Photoactive material 170 may undergo a chemical or physical change in response to exposure to a particular type of light. There are many types of photoactive materials that may be used. In one example, photoactive material 170 may be a photopolymer. Polymerization of the material may be initiated by exposure to light. For example, photoactive material 170 may initially be formed entirely of monomers. The portions of photoactive material 170 that are then exposed to light will polymerize to become polymers. In another embodiment, photoactive material 170 may be a chalcogenide glass. When exposed to light, the exposed portions of the chalcogenide glass may have a higher index of refraction than portions that are not exposed to the light, forming light guiding channels.

FIG. 8 shows an embodiment where a single light source is used to activate photoactive material 170. As shown, light source 172 emits a beam of light 174 through photoactive material 170. Light source 172 may emit any desired type of light that activates photoactive material 170. For example, light source 172 may emit visible light, ultraviolet light, or infrared light. Light source 172 may be a laser or another desired type of light source.

At step 502 when light source 172 emits beam 174 through photoactive material 170, region 176 of photoactive material 170 is activated by the light. As shown in FIG. 8 at step 504, this results in the formation of a channel 178. Channel 178 may be a portion of photoactive material 170 that has been activated to form a fiber for a fiber relay. Channel 178 may have a high refractive index that allows the channel to guide light from display panel 160 to display cover layer 162 (or another desired electronic device structure). Multiple channels may be formed using photoactive material 170 to form a fiber relay. Each channel may form a respective fiber for the fiber relay. Each fiber may be aligned with exactly one pixel in display 14, multiple pixels in display 14, or a portion of a pixel in display 14.

Using a single light source to activate photoactive material 170 may result in each fiber having a linear structure (e.g., each fiber extends along a single axis). Multiple light sources may instead by used to produce fibers with any desired three-dimensional structure. In this technique, multiple light sources may emit beams through photoactive material 170. However, only portions of photoactive material 170 that are exposed to both light sources will be activated. This enables the activated portion to be precisely controlled in three-dimensions through the photoactive material.

Figure 9:
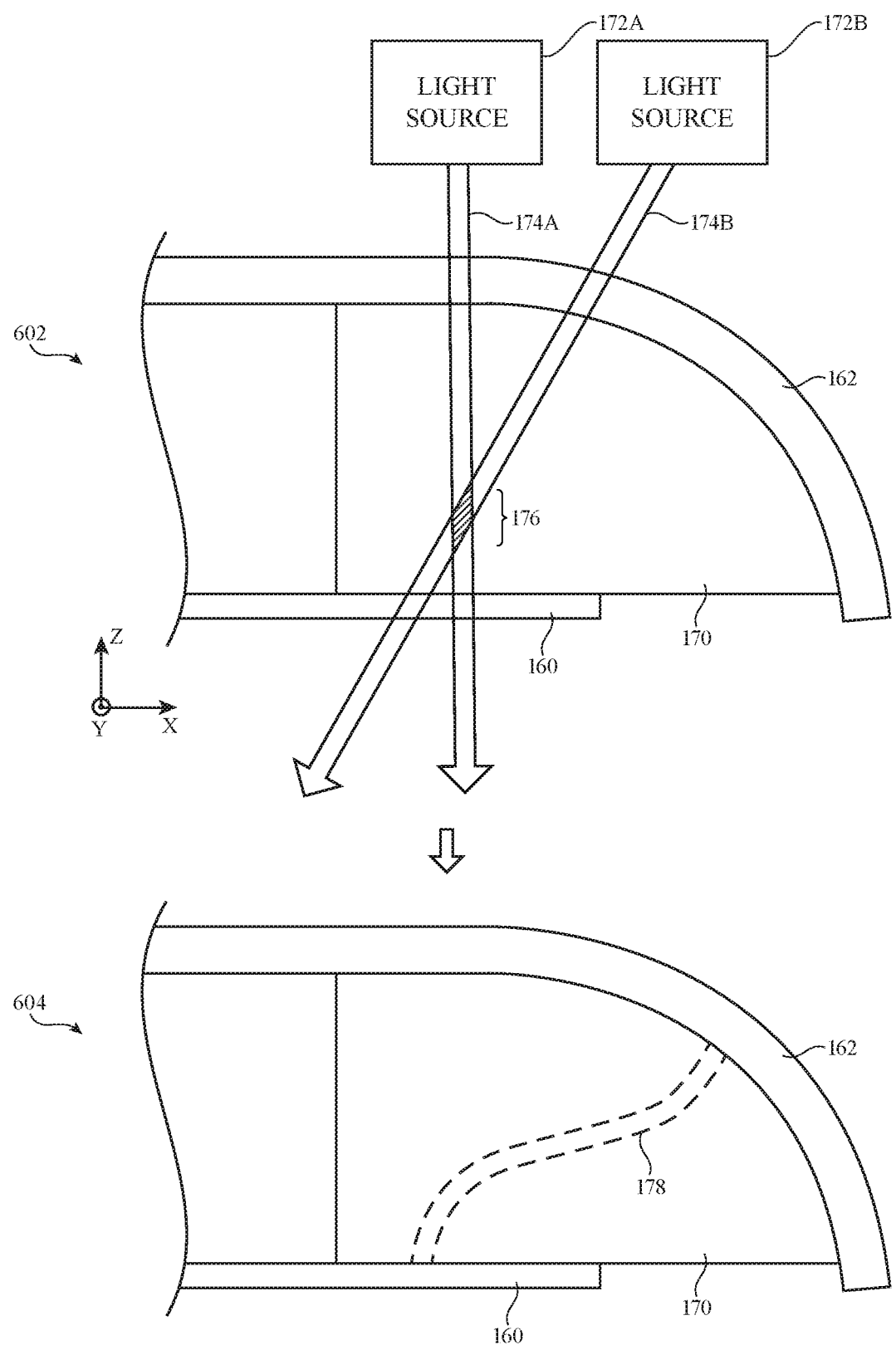
FIG. 9 shows cross-sectional side views of steps for forming a fiber using a photoactive material and two or more light sources in accordance with an embodiment.

FIG. 9 shows an embodiment where multiple light sources are used to activate photoactive material 170. As shown, light source 172A emits a beam of light 174A through photoactive material 170 and light source 172B emits a beam of light 174B through photoactive material 170. Light sources 172A and 172B may emit any desired type of light that activates photoactive material 170 (e.g., visible light, ultraviolet light, infrared light etc.). Light sources 172A and 172B may be lasers or other desired types of light sources.

At step 602 when light source 172A emits beam 174A through photoactive material 170 and light source 172B emits beam 174B through photoactive material 170, region 176 of photoactive material 170 that is exposed to both beams 174A and 174B may be activated. As shown in FIG. 9 at step 604, this intersection point between the beams may be moved in any direction in three-dimensions to form a channel 178 with any desired shape. Channel 178 is the portion of photoactive material 170 that has been activated to form a fiber for the fiber relay. Due to being activated by the light exposure, channel 178 may have a high refractive index that allows the channel to guide light from display panel 160 to display cover layer 162 (or another desired electronic device structure). Multiple channels may be formed in this way using photoactive material 170 to form a fiber relay. Each channel may form a fiber for the fiber relay. Each fiber may be aligned with exactly one pixel in display 14, multiple pixels in display 14, or a portion of a pixel in display 14.

Figure 10:
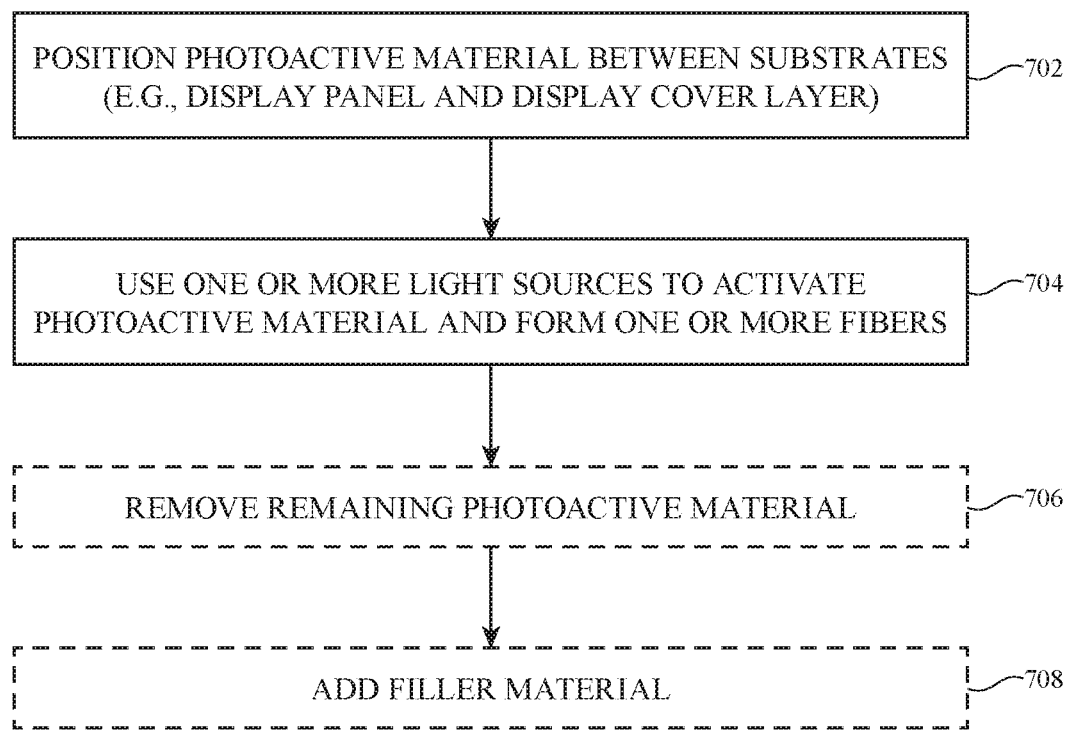
FIG. 10 is a flowchart of illustrative method steps for using photoactive material to form a fiber relay between a display panel and a display cover layer in accordance with an embodiment.

FIG. 10 is a flowchart of illustrative method steps for forming a fiber relay using a photoactive material. As shown in FIG. 10, at step 702 the photoactive material may be positioned between the two substrates of interest (or positioned above one substrate, with the additional substrate to be added after activation). For example, when the fiber relay is used to relay light from a display panel to a curved display output surface, the photoactive material may be positioned between the display panel and the display cover layer. Next, at step 704, one or more light sources may be used to activate the photoactive material and form one or more fibers for the fiber relay. Portions of the photoactive material that are exposed to light from the one or more light sources may be activated and form a channel that guides light from the display panel to the display cover layer. One light source may be used to form a plurality of linear fibers or multiple light sources may be used to form fibers with non-linear shapes. Once all of the fibers have been formed in the photoactive material, the remaining photoactive material may optionally be exposed to a capping agent that reduces the reactivity of the photoactive material.

If desired, the portions of the photoactive material that were not activated in step 704 may remain between the display panel and the display cover layer. These remaining portions may act as a host matrix that help maintain the shape of the fibers. Alternatively, the portions of the photoactive material that were not activated in step 704 may optionally be removed at step 706. If the portions of the photoactive material that were not activated in step 704 are removed at step 706, an additional filler material may optionally be added at step 708. The additional filler material may conform to the shape of the fibers and fill any voids between the fibers. This may help maintain the structural integrity of the fibers and keep the fibers in a desired position. Any desired material may be used as the additional filler material in step 708.

As previously discussed, fiber relays may use a plurality of fibers to guide light from a display panel to a display output surface. The fiber relay may be used to cover (and guide light from) any desired portion of the display panel. FIGS. 11A-11C are top views showing various arrangements with at least a portion of the display panel covered by fibers.

FIG. 11A shows an illustrative display 14 where the entire display panel is covered by fiber relay 142. In other words, every pixel may emit light into one or more fibers that then guide the emitted light to a display output surface. The display output surface may have any desired shape. In some embodiments, a central portion of the display output surface may be planar while a peripheral portion of the display output surface may be curved. The corner portions of the display output surface may have compound curvature, for example. In the central portion of the fiber relay, fibers may guide light straight up from the central portion of the display panel to the display output surface (without any curvature). Fibers that overlap the peripheral portions of the display, however, may be bent in order to guide light to the curved edges of the display output surface.

In another embodiment, shown in FIG. 11B, only a portion of the display panel may be covered by fibers. In the example of FIG. 11B, the peripheral portion of the display panel is covered by fiber relay 142 whereas the central portion of the display panel is not covered by fiber relay 142. In this type of arrangement, a central portion of the display output surface may be planar (because light is being emitted from the central portion of the display without modification by the fibers). An edge portion of the display output surface, however, may use the fiber relay 142 to have any desired three-dimensional shape. For example, the fiber relay may be used to create a curved edge for the display output surface around the entire periphery of the display. The display output surface may have compound curvature in each of the four corners of the display and may have curvature along a single axis along the edges that extend between the four corners. This example of the entire periphery of the display output surface having a curved edge is merely illustrative. If desired, only one edge, only two edges, or only three edges of the display output surface may be curved using the fiber relay.

In yet another embodiment, shown in FIG. 11C, only the corners of the display panel are covered by fibers. The display may have a rectangular shape with an upper left corner, an upper right corner, a lower left corner, and a lower right corner. The corners may optionally be rounded corners. A first fiber relay 142A is formed over a first corner (e.g., an upper-left corner) of the display panel, a second fiber relay 142B is formed over a second corner (e.g., an upper-right corner) of the display panel, a third fiber relay 142C is formed over a third corner (e.g., a lower-left corner) of the display panel, and a fourth fiber relay 142D is formed over a fourth corner (e.g., a lower-right corner) of the display panel. Edge portions of the display panel that run between the corners, as well as a central portion of the display panel, are not covered by fibers. In this type of arrangement, a central portion of the display output surface (e.g., non-corner portions) may be planar (because light is being emitted from the central portion of the display without modification by the fibers). The corners of the display output surface, however, may use the fiber relays to have any desired three-dimensional shape (e.g., compound curvature). This example of the four corners of the display output surface being curved is merely illustrative. If desired, only one corner, only two corners, or only three corners of the display output surface may be curved using the fiber relay.

Forming fiber relays in the corners of the display may be particularly helpful given the limitations of bending the display panel itself. To help form a curved display output surface, the display panel may be bent. This may result in the display output surface being curved (even without the use of a fiber relay). However, the display panel may only be able to accommodate bends along a single axis at a time. Thus, forming a display output surface with certain three-dimensional shapes may still be difficult. Forming fiber relays in the corner of the display may enable the display output surface to have multiple bends (e.g., a rounded corner that is bent downwards). The display output surface may therefore use the four discrete fiber relays of FIG. 11C to have compound curvature in the corners.

Figure 12:
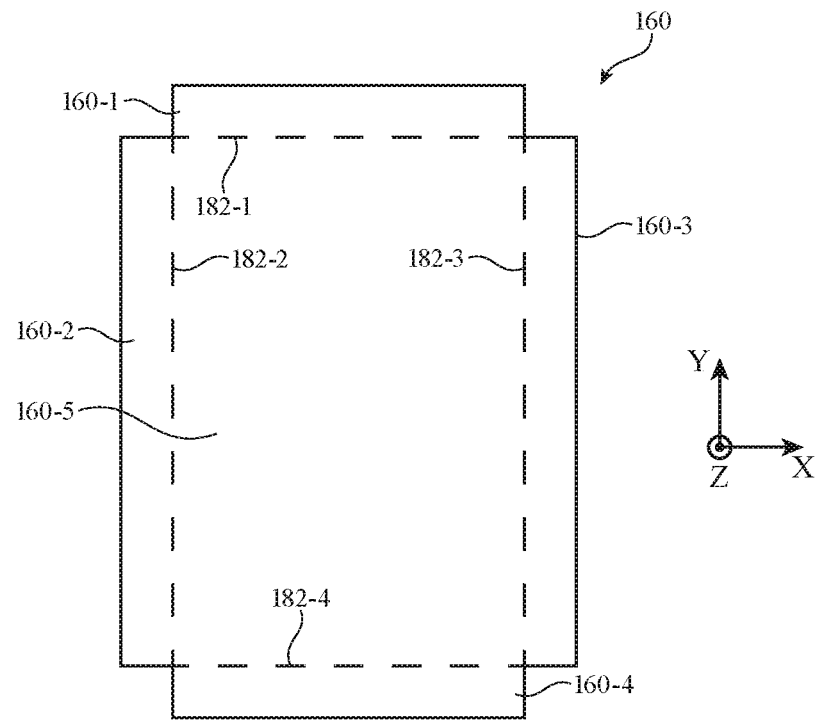
FIG. 12 is a top view of an illustrative display panel that is bent in accordance with an embodiment.

FIG. 12 is a top view of an illustrative display panel that is bent to form a curved display output surface. FIG. 12 depicts display panel 160 in an unbent state (e.g., before the extensions of the display panel have been bent). As shown, display panel 160 (which may sometimes be referred to as a display active area that includes display pixels) may include display panel extensions (sometimes referred to as display panel tabs, bent regions, or bent portions of the display panel) 160-1, 160-2, 160-3, and 160-4. Each display panel extension is configured to be bent along a respective bend axis. Display panel extension 160-1 is configured to be bent along bend axis 182-1, display panel extension 160-2 is configured to be bent along bend axis 182-2, display panel extension 160-3 is configured to be bent along bend axis 182-3, and display panel extension 160-4 is configured to be bent along bend axis 182-4. Bend axes 182-1 and 182-4 may be parallel and bend axes 182-2 and 182-3 may be parallel. Bend axis 182-1 may be perpendicular to bend axes 182-2 and 182-3. The display panel extensions may surround a central portion 160-5 of the display panel that is not bent.

By bending the display panel as shown in FIG. 12, the periphery of the display output surface may be curved (as the display panel includes display pixels on the central portion and the display panel extensions). This example of the display panel having four display panel extensions (around the entire periphery of the display) that are bent is merely illustrative. If desired, the display panel may have only one display panel extension that is bent, only two display panel extensions that are bent, or only three display panel extensions that are bent. In all of these embodiments, any desired portion(s) of the display panel may be covered by fibers. The fibers may be used to further curve the display output surface (e.g., to have compound curvature), for example.

Figure 13:
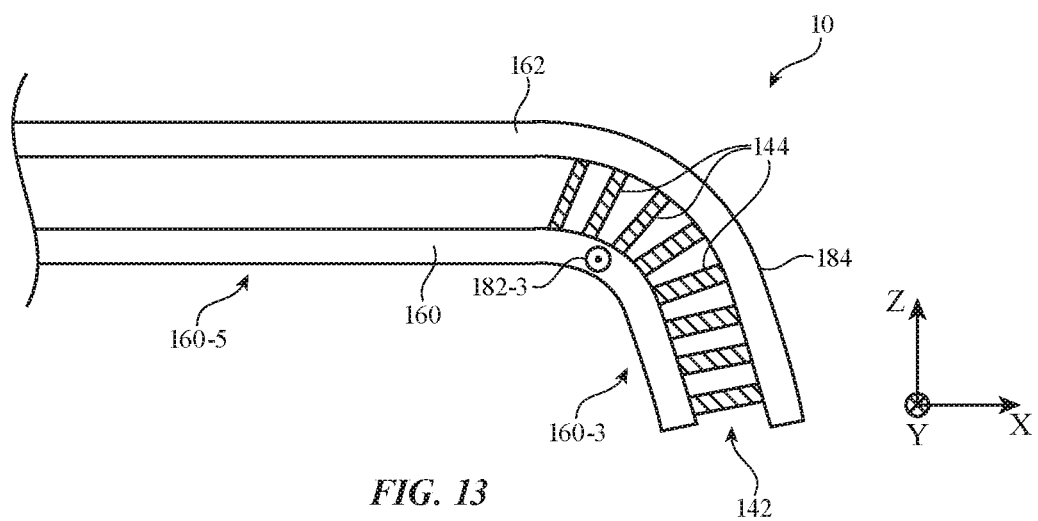
FIG. 13 is a cross-sectional side view of an illustrative electronic device with a bent display panel and a fiber relay in accordance with an embodiment.

FIG. 13 is a cross-sectional side view of an illustrative electronic device with a bent display panel (e.g., the display panel of FIG. 12) and a fiber relay. As shown, display panel extension 160-3 is bent around bend axis 182-3 relative to central display panel portion 160-5. This helps promote a curved display output surface (e.g., display output surface 184). The display in FIG. 13 also includes fiber relay 142. Fiber relay 142 includes fibers 144 that guide light from display panel 160 to display cover layer 162. The fibers may enable further curvature of the display output surface if desired. Bending the display panel as shown in FIG. 13 may minimize the relay distance required by fiber relay 142 (which may improve the display performance).

Figure 14:
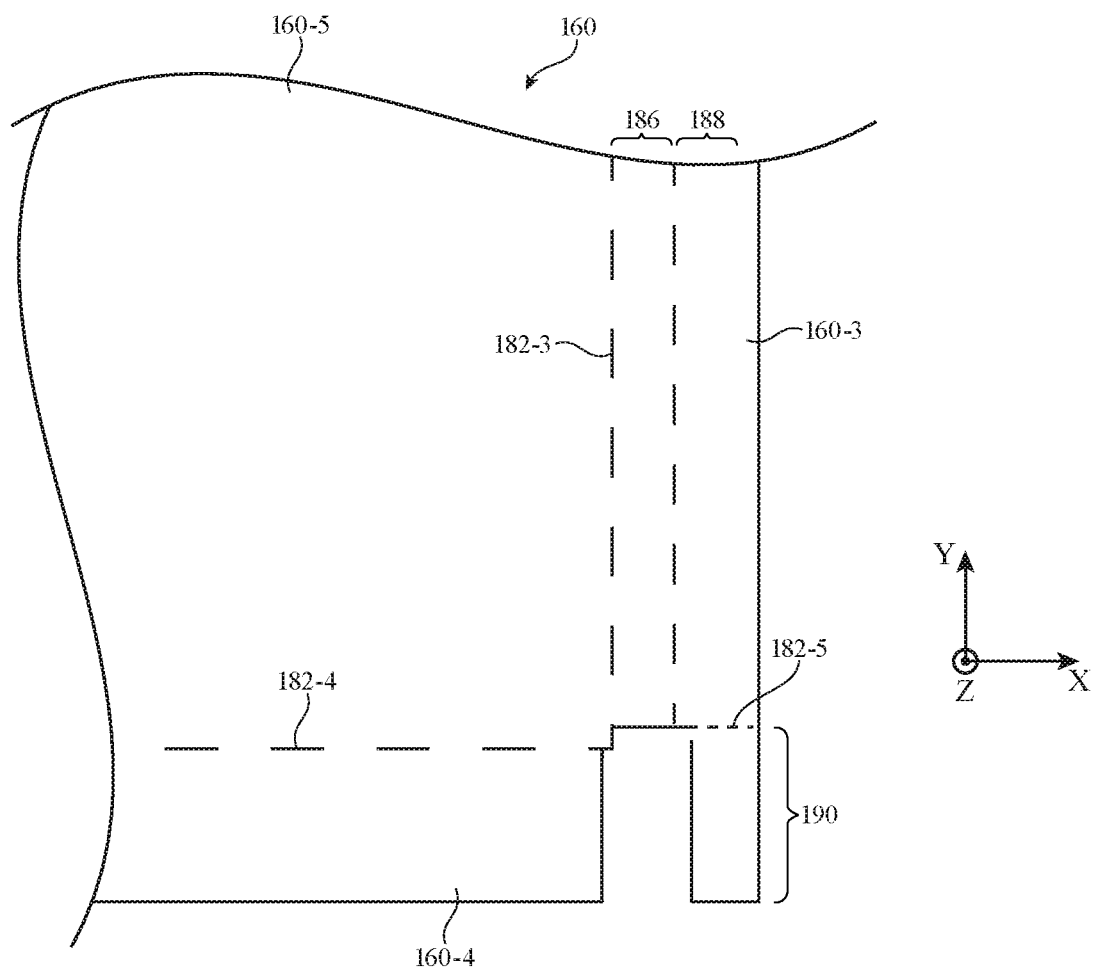
FIG. 14 is a top view of an illustrative display panel with multiple bends in accordance with an embodiment.

The display panel may have additional extensions to accommodate desired curved display output surfaces while still only bending the display panel along a single bend axis at a time. FIG. 14 is a top view of an illustrative display panel that is bent to form a curved display output surface. FIG. 14 depicts display panel 160 in an unbent state (e.g., before the extensions of the display panel have been bent). As shown, display panel 160 may have display panel extensions 160-3 and 160-4 bent along axes 182-3 and 182-4 respectively (similar to as discussed in connection with FIG. 12). It may be desirable to make additional bends to display panel extension 160-3 (e.g., to further reduce the relay distance of a fiber relay that will overlap the corner of the display panel). However, as discussed previously each portion of the display panel can only be bent in one direction. Therefore, once display panel extension 160-3 is bent along axis 182-3, a planar portion of display panel extension 160-3 may be bent along axis 182-5.

When display panel extension 160-3 in FIG. 14 is bent downwards (e.g., into the page), portion 186 may be bent. The curvature of the bend may start at bend axis 182-3 and be limited to region 186 of the display panel extension. The remaining portion 188 of the display panel extension may be planar (even after the extension is bent along axis 182-3). The remaining portion 188 of the display panel extension may, for example, be positioned in the YZ-plane after the extension is bent in region 186. This planar portion 188 may have an extended portion 190 that is then bent along bend axis 182-5. The extended portion 190 of the display panel may be used to form a rounded corner shape for the display.

Figure 15:
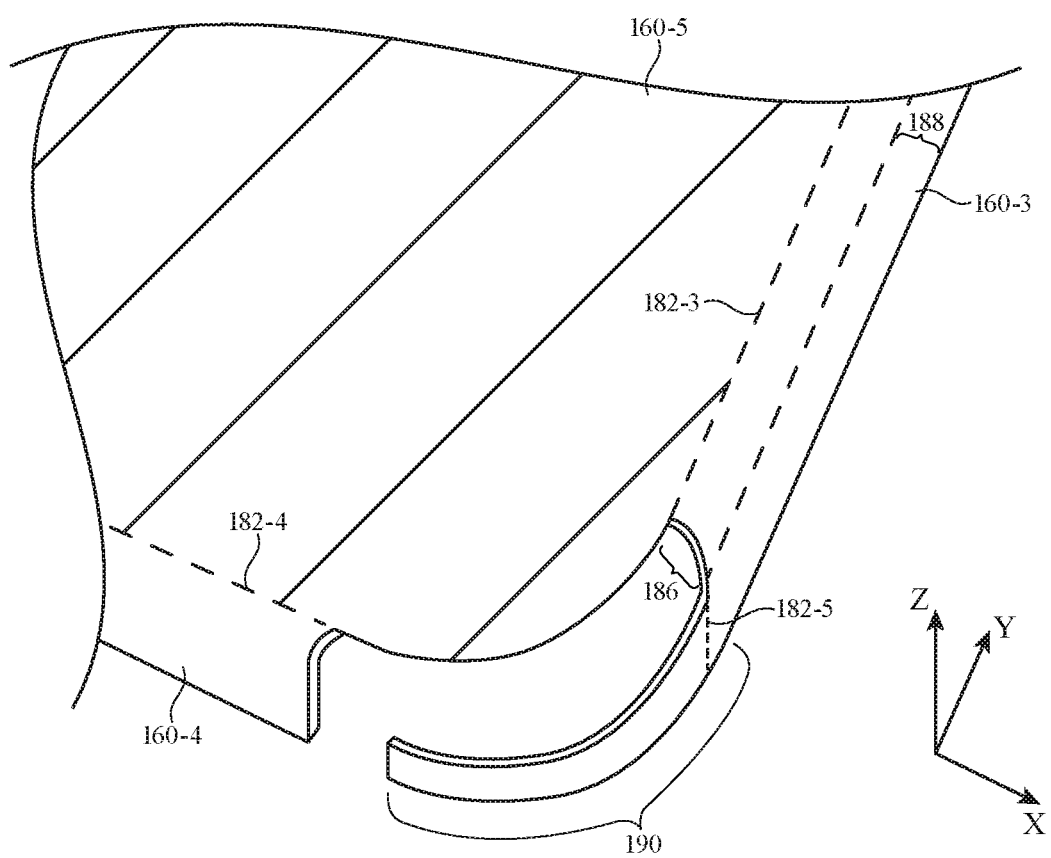
FIG. 15 is a perspective view of the illustrative display panel of FIG. 14 after the display panel has been bent in accordance with an embodiment.

FIG. 15 is a perspective view of the display panel of FIG. 14 after the display panel has been bent. As shown in FIG. 15, the central portion 160-5 of the display panel lies parallel to the XY-plane. The display panel extension 160-4 is bent downwards (e.g., in the negative Z-direction) along bend axis 182-4 (which is parallel to the X-axis). Display panel extension 160-3 is bent downwards in region 186 along axis 182-3 (which is parallel to the Y-axis). Finally, extension 190 of planar portion 188 is bent along axis 182-5 into a rounded corner shape. The display panel may include display pixels on all of the display panel portions shown in FIG. 15. Therefore, even though extension 190 is only bent once (thus satisfying the reliability requirements for the display panel), the display panel can approximate a display output surface with a rounded corner that is bent downwards (i.e., the display panel can approximate a display output surface with compound curvature).

Liquid crystal displays, organic light-emitting diode displays, and other types of displays that may be used to form the display panel may include a linear polarizer layer. For example, the liquid crystal display (LCD) in FIG. 3 includes an upper polarizer 54 and the organic light-emitting diode (OLED) display in FIG. 4 includes a circular polarizer 100 (that includes a linear polarizer). In these cases, the polarizer layer must be interposed between the display layer (e.g., the light-emitting diodes of an OLED display or the liquid crystal layer of an LCD display) and the outer surface of the electronic device. An arrangement of this type is shown in FIG. 16.

Figure 16:
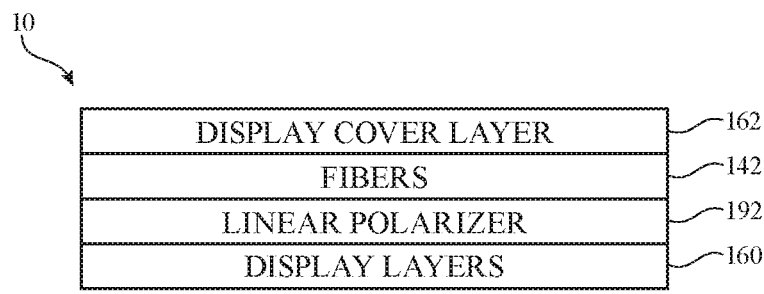
FIG. 16 is a cross-sectional side view of an illustrative electronic device with fibers between a linear polarizer and a display cover layer in accordance with an embodiment.

FIG. 16 is a cross-sectional side view of an electronic device with a display, a linear polarizer, and a fiber relay. As shown in FIG. 16, linear polarizer 192 may be formed over display layers of the display (e.g., display panel 160). Fibers 142 are then formed over the linear polarizer and interposed between the linear polarizer and the display cover layer 162. In this arrangement, the display plane (e.g., display panel 160) is spatially separated from the outer surface of the electronic device (e.g., the outer surface of display cover layer 162), which can be aesthetically undesirable.

Figure 17:
FIG. 17 is a cross-sectional side view of an illustrative electronic device with polarizing fibers that replace the function of a linear polarizer in accordance with an embodiment.

To minimize the distance between the display plane and the outer surface of the electronic device, polarizing fibers may be used in fiber relay 142. The linear polarizer can therefore be eliminated from the stack-up, moving the display plane closer to the outer surface of the electronic device (for improved aesthetics) and reducing the thickness of the display. An arrangement of this type is shown in FIG. 17. As shown, fiber relay 142 includes polarizing fibers that will replace the function of the linear polarizer 192 from FIG. 16.

Polarizing fibers 142 in FIG. 17 may have a structure similar to those shown in FIG. 5 (e.g., with each fiber having a core surrounded by a cladding and a host matrix material between each fiber). The polarizing functionality may be achieved by adding a chiral dopant to the core of the fibers. In the polarized fibers, light of the desired polarization will be guided through the fiber. In contrast, light of the undesired polarization will be ejected out of the core and into the host matrix material. The host matrix material may be blackened to prevent light leakage if desired.

If the display of FIG. 17 is a liquid crystal display, polarizing fibers 142 may take the place of the upper polarizer of the liquid crystal display. For example, polarizing fibers 142 may be attached to transparent substrate 56 in FIG. 3 without an intervening linear polarizer layer. The polarizing fibers may be the only linear polarizer that is interposed between the liquid crystal layer of the liquid crystal display and the outer surface of the electronic device. If the display of FIG. 17 is an organic light-emitting diode display, polarizing fibers 142 may take the place of the linear polarizer in the circular polarizer of the liquid crystal display. For example, polarizing fibers 142 may be attached to thin-film transistor circuitry 92 in FIG. 4 without an intervening linear polarizer layer. The circular polarizer for the organic light-emitting diode display may still require a quarter wave plate. The polarizing fibers may be attached to a quarter wave plate for the circular polarizer without an intervening linear polarizer layer. The polarizing fibers may be the only linear polarizer that is interposed between the light-emitting diodes of the organic light-emitting diode display and the outer surface of the electronic device.

The polarizing fibers in polarizing fiber relay 142 may have any desired length (e.g., less than 10 millimeters, less than 1 millimeter, less than 100 microns, less than 10 microns, greater than 1 micron, greater than 10 microns, greater than 100 microns etc.). The polarizing fibers may cover any desired portion of the display panel (e.g., the entire display panel as shown in FIG. 11A, the edges of the display panel as shown in FIG. 11B, or the corners of the display panel as shown in FIG. 11C) and the display panel may have any desired number of bends.

Figure 18:
FIG. 18 is a cross-sectional side view of an illustrative electronic device with polarizing fibers that form an outermost surface of the electronic device in accordance with an embodiment.

FIG. 18 is a cross-sectional side view of an illustrative embodiment where the polarizing fibers form an outer surface of the electronic device. In this arrangement, no display cover layer may be formed over the polarizing fibers, allowing the display plane to appear to be on the outer surface of the electronic device. This type of arrangement allows for the possibility of opaque materials covering the display, as shown in FIG. 19.

Figure 19:
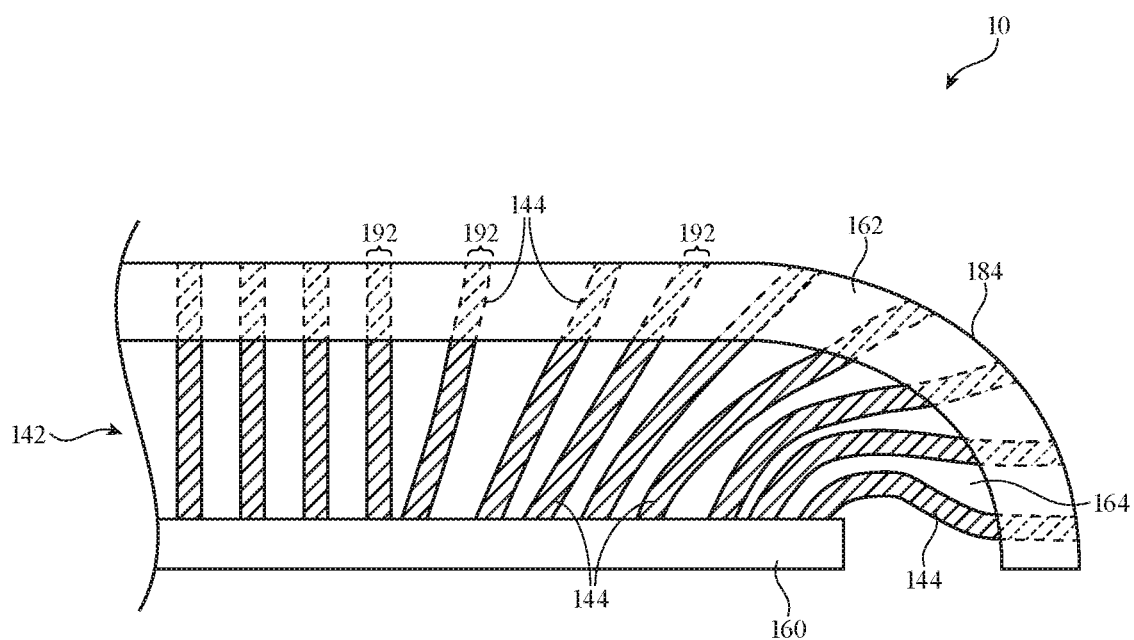
FIG. 19 is a cross-sectional side view of an illustrative electronic device with fibers that protrude into openings in the display cover layer to form an outermost surface of the electronic device in accordance with an embodiment.

FIG. 19 is a cross-sectional side view of an electronic device with a display cover layer 162 that may be non-transparent (e.g., opaque). As shown in FIG. 19, display cover layer 162 has a number of openings 192 that receive fibers 144 of fiber relay 142. Fibers 144 may guide light directly from the display panel 160 to the outermost surface of the electronic device (e.g., surface 184). The fibers 144 and display cover layer 162 may combine to form the outermost surface of the electronic device. Display cover layer 162 may be formed from an opaque material in this embodiment. For example, display cover layer 162 may be metal, ceramic, or another opaque material.

FIG. 19 shows one fiber formed in each opening of display cover layer 162. This example is merely illustrative. If desired, more than one fiber may be formed in each opening of display cover layer 162. The openings of the display cover layer may be formed and then the fibers may be inserted into the openings. Alternatively, the display cover layer may be grown or molded around the fibers such that the fibers are embedded in the display cover layer.

As shown in FIG. 19, a filler material 164 may be formed in between fibers 144 of fiber relay 142. Filler material 164 may conform to the shape of the fibers to fill any voids between the fibers. This may help maintain the structural integrity of the fibers and keep the fibers in a desired position. Filler material 164 may be any desired material. Filler material 164 may be opaque or transparent. In some embodiments, display cover layer 162 may be omitted and filler material 164 may be the only component maintaining the structure of the fibers. In this scenario, filler material 164 may also form a portion of the outermost surface of the electronic device.

Fibers of the type shown in FIG. 19 may cover any desired portion of the display panel (e.g., the entire display panel as shown in FIG. 11A, the edges of the display panel as shown in FIG. 11B, or the corners of the display panel as shown in FIG. 11C) and the display panel may have any desired number of bends.

In various embodiments, an electronic device may include a display panel having first and second opposing edges that couple to third and fourth opposing edges to form four corners, a plurality of groups of fibers that are each aligned with a respective corner of the display panel, and a display cover layer formed over the plurality of groups of fibers. Each group of fibers may include a plurality of fibers that guide light from the display panel to a curved interior surface of the display cover layer.

Each fiber of the plurality of fibers of each group of fibers may include a cladding that surrounds a core with a higher index of refraction than the cladding. Each group of fibers may have a filler material that fills space between the plurality of fibers in that group of fibers. Each group of fibers may be attached between the display panel and a respective flexible substrate. Each flexible substrate may be attached to the curved interior surface of the display panel. Each fiber of the plurality of fibers of each group of fibers may include an activated photoactive material. Each fiber of the plurality of fibers of each group of fibers may be a polarizing fiber that serves as a linear polarizer. The display panel may have a planar central portion and a first display panel extension and the first display panel extension may run along the first edge of the display panel and may be bent around a first bend axis relative to the planar central portion of the display panel. The first display panel extension may have a curved portion and a planar portion and the planar portion may have an additional extension that is bent around a second bend axis.

In various embodiments, an electronic device may include display structures having an array of display pixels and a plurality of polarizing fibers formed on the display structures that guide light from the array of display pixels towards a display surface. The display structures may include liquid crystal display structures, the liquid crystal display structures may include a lower linear polarizer and a liquid crystal layer, and the plurality of polarizing fibers may serve as an upper linear polarizer for the liquid crystal display structures. The display structures may include organic light-emitting diode structures, the organic light-emitting diode structures may include a circular polarizer, and the plurality of polarizing fibers may serve as a linear polarizer for the circular polarizer. The electronic device may also include an opaque display cover layer with a plurality of openings and each polarizing fiber of the plurality of polarizing fibers may protrude into an opening of the plurality of openings.

In various embodiments, a method of forming a plurality of fibers between a display panel and a display cover layer in an electronic device includes forming a photoactive material between the display panel and the display cover layer and activating portions of the photoactive material to form the plurality of fibers with at least one light source. Each fiber of the plurality of fibers may guide light from at least one display pixel of the display panel to a curved interior surface of the display cover layer.

Activating the portions of the photoactive material to form the plurality of fibers with the at least one light source may include using a single laser to emit a beam of light through the photoactive material to form each fiber of the plurality of fibers. Activating the portions of the photoactive material to form the plurality of fibers with the at least one light source may include using first and second lasers to emit respective first and second beams of light through the photoactive material to form each fiber of the plurality of fibers. Only portions of the photoactive material that are exposed to both the first and second beams of light may be activated. The method may also include removing remaining portions of the photoactive material after activating the portions of the photoactive material to form the plurality of fibers. The method may also include adding a filler material between the plurality of fibers after removing the remaining portions of the photoactive material. Forming the photoactive material between the display panel and the display cover layer may include forming a photopolymer between the display panel and the display cover layer. Forming the photoactive material between the display panel and the display cover layer may include forming a chalcogenide glass between the display panel and the display cover layer.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   a display panel that displays an image;
   a display cover layer that covers the display panel; and
   fibers interposed between the display panel and the display cover layer that overlap a corner portion of the display panel, wherein the fibers receive a portion of the image from the display panel and present the portion of the image at an output surface of the fibers that has compound curvature in a rounded corner that is bent downwards towards the display panel.

2. The electronic device defined in claim 1, wherein each fiber comprises a cladding that surrounds a core that has a higher index of refraction than the cladding.

3. The electronic device defined in claim 2, further comprising:
   filler material that fills space between the fibers.

4. The electronic device defined in claim 1, wherein the display panel comprises a flexible display panel with a bent portion.

5. The electronic device defined in claim 4, wherein the fibers overlap pixels in the bent portion of the flexible display panel.

6. The electronic device defined in claim 5, wherein the fibers also overlap pixels in a central planar portion of the flexible display panel.

7. The electronic device defined in claim 1, wherein the fibers have an input surface adjacent to the display panel and wherein the fibers guide light from the input surface to the output surface.

8. An electronic device comprising:
   a display panel that emits light;
   four discrete fiber bundles, wherein each fiber bundle overlaps a respective corner portion of the display panel and wherein the display panel has edge portions that are not covered by any fibers; and
   a display cover layer formed over the fiber bundles, wherein each fiber bundle comprises fibers that guide the light from the display panel to an interior surface of the display cover layer.

9. The electronic device defined in claim 8, wherein the interior surface of the display cover layer is a curved interior surface.

10. The electronic device defined in claim 9, wherein each fiber bundle has an output surface that conforms to the curved interior surface of the display cover layer.

11. The electronic device defined in claim 8, wherein each fiber bundle has an input surface that receives the light from the display panel and conveys the light from the input surface to an output surface.

12. The electronic device defined in claim 8, wherein each fiber comprises a cladding that surrounds a core with a higher index of refraction than the cladding.

13. The electronic device defined in claim 12, wherein each fiber bundle has a filler material that fills space between the fibers in that fiber bundle.

14. The electronic device defined in claim 12, wherein each fiber bundle is attached between the display panel and a respective flexible substrate.

15. The electronic device defined in claim 14, wherein each flexible substrate is attached to the interior surface of the display cover layer.

16. The electronic device defined in claim 8, wherein each fiber comprises an activated photoactive material.

17. The electronic device defined in claim 8, wherein each fiber is a polarizing fiber that serves as a linear polarizer.

18. An electronic device comprising:
   a display cover layer with first and second opposing edges that couple to third and fourth opposing edges to form four corner regions; and
   a display panel that is covered by the display cover layer, wherein the display panel has a planar central portion, a first display panel extension that extends from the planar central portion along the first edge and that is bent relative to the planar central portion, and a second display panel extension that extends from the first display panel extension into one of the four corner regions, and wherein the planar central portion, the first display panel extension, and the second display panel extension include pixels.

19. The electronic device defined in claim 18, wherein the first display panel extension has a planar portion and a bent portion and wherein the bent portion of the first display panel extension is interposed between the planar central portion of the display panel and the planar portion of the first display panel extension.

20. The electronic device defined in claim 19, wherein the second display panel extension extends from the planar portion of the first display panel extension and is bent relative to the planar portion of the first display panel extension, wherein the first display panel extension is bent relative to the planar central portion about a first axis and wherein the second display panel extension is bent relative to the planar portion of the first display panel extension about a second axis that is different than the first axis.

21. The electronic device defined in claim 18, wherein the planar central portion, first display panel extension, and second display panel extension form part of an active area of the display panel.

22. A method of forming a plurality of fibers that are configured to guide light from display pixels in a display panel to a curved interior surface of a display cover layer in an electronic device, the method comprising:
   forming a layer of photoactive material; and
   with at least one light source, activating portions of the photoactive material, wherein each activated portion of the photoactive material forms a respective fiber of the plurality of fibers.

23. The method defined in claim 22, wherein activating the portions of the photoactive material with the at least one light source comprises using a single laser to emit a beam of light through the photoactive material to form each respective fiber of the plurality of fibers.

24. The method defined in claim 22, wherein activating the portions of the photoactive material with the at least one light source comprises using first and second lasers to emit respective first and second beams of light through the photoactive material to form each respective fiber of the plurality of fibers and wherein only portions of the photoactive material that are exposed to both the first and second beams of light are activated.

25. The method defined in claim 22, further comprising:
   after activating the portions of the photoactive material, removing remaining portions of the photoactive material; and
   after removing the remaining portions of the photoactive material, adding a filler material between the plurality of fibers.

26. The method defined in claim 22, wherein forming the layer of photoactive material comprises forming the layer of photoactive material between the display panel and the display cover layer.

27. The method defined in claim 22, wherein forming the layer of photoactive material comprises forming the layer of photoactive material over the display panel.

28. The method defined in claim 22, wherein forming the layer of photoactive material comprises forming the layer of photoactive material below the display cover layer.

29. The method defined in claim 22, wherein forming the layer of photoactive material comprises forming a photopolymer.

30. The method defined in claim 22, wherein forming the layer of photoactive material comprises forming a chalcogenide glass.

31. An electronic device comprising:
a an array of organic light-emitting diode pixels; and
a circular polarizer that overlaps the array of organic light-emitting diode pixels, wherein the circular polarizer includes a linear polarizer formed from a plurality of polarizing fibers that guide light from the array of organic light-emitting diode pixels towards a display output surface.

32. The electronic device defined in claim 31, further comprising:
an opaque display cover layer with a plurality of openings, wherein each polarizing fiber of the plurality of polarizing fibers protrudes into an opening of the plurality of openings.

33. An electronic device comprising:
a display panel that displays an image; and
fibers that overlap a corner portion of the display panel, wherein the fibers receive a portion of the image from the display panel and present the portion of the image at an output surface of the fibers that has compound curvature in a rounded corner that is bent downwards.

34. The electronic device defined in claim 33, wherein each fiber comprises a cladding that surrounds a core and wherein the core has a higher index of refraction than the cladding.

35. The electronic device defined in claim 33, wherein the fibers have an input surface adjacent to the display panel and wherein the fibers guide light from the input surface to the output surface.

36. An electronic device comprising:
a display panel that displays an image; and
fibers that overlap a corner portion of the display panel, wherein the fibers receive a portion of the image from the display panel and present the portion of the image at an output surface of the fibers that has compound curvature in a corner that is bent.

37. An electronic device comprising:
a display panel that emits light;
four discrete fiber bundles, wherein each fiber bundle overlaps a respective corner portion of the display panel and wherein the display panel has edge portions that are not covered by any fibers.

* * * * *